(12) United States Patent
Brabant et al.

(10) Patent No.: US 7,108,748 B2
(45) Date of Patent: Sep. 19, 2006

(54) LOW TEMPERATURE LOAD AND BAKE

(75) Inventors: Paul D. Brabant, Phoenix, AZ (US); Joe P. Italiano, Phoenix, AZ (US); Jianqing Wen, Gloria Mansion (SG)

(73) Assignee: ASM America, Inc., Phoenix, AZ (US)

( * ) Notice: Subject to any disclaimer, the term of this patent is extended or adjusted under 35 U.S.C. 154(b) by 346 days.

(21) Appl. No.: 10/158,393

(22) Filed: May 29, 2002

(65) Prior Publication Data

US 2003/0036268 A1 Feb. 20, 2003

Related U.S. Application Data

(60) Provisional application No. 60/294,385, filed on May 30, 2001.

(51) Int. Cl.
*C60B 25/10* (2006.01)

(52) U.S. Cl. .............. 117/88; 117/90; 117/94; 117/106

(58) Field of Classification Search .................. 117/80, 117/90, 94, 106
See application file for complete search history.

(56) References Cited

U.S. PATENT DOCUMENTS

| | | | |
|---|---|---|---|
| 4,210,925 A * | 7/1980 | Morcom et al. | 357/46 |
| 4,749,440 A | 6/1988 | Blackwood et al. | |
| 4,870,030 A | 9/1989 | Markunas et al. | 437/81 |
| 5,011,789 A * | 4/1991 | Burns | 437/81 |
| 5,028,973 A | 7/1991 | Bajor | |
| 5,129,958 A * | 7/1992 | Nagashima et al. | 134/22.1 |
| 5,144,376 A | 9/1992 | Kweon | |
| 5,158,644 A | 10/1992 | Cheung et al. | |
| 5,211,796 A | 5/1993 | Hansen | |
| 5,252,841 A | 10/1993 | Wen et al. | |
| 5,285,089 A | 2/1994 | Das | |
| 5,319,220 A | 6/1994 | Suzuki et al. | |
| 5,323,032 A | 6/1994 | Sato et al. | |
| 5,326,992 A | 7/1994 | Yoder | |
| 5,373,806 A * | 12/1994 | Logar | 117/106 |
| 5,378,901 A | 1/1995 | Nii | |
| 5,380,370 A | 1/1995 | Niino et al. | |
| 5,403,434 A | 4/1995 | Moslehi | 156/643 |
| 5,421,957 A | 6/1995 | Carlson et al. | |

(Continued)

OTHER PUBLICATIONS

Wolf et al., Silicon Processing for the VLSI Era vol. 1: Process Technology, Lattice Press, Sunset Beach, CA, USA, pp. 140-1142, 155-156, 1986.*

(Continued)

*Primary Examiner*—Robert Kunemund
(74) *Attorney, Agent, or Firm*—Knobbe Martens Olson & Bear LLP

(57) ABSTRACT

Methods are provided for low temperature, rapid baking to remove impurities from a semiconductor surface prior to in-situ deposition. Advantageously, a short, low temperature process consumes very little of the thermal budget, such that the process is suitable for advanced, high density circuits with shallow junctions. Furthermore, throughput is greatly improved by the low temperature bake, particularly in combination with low temperature plasma cleaning and low temperature wafer loading prior to the bake, and deposition after the bake at temperatures lower than conventional epitaxial deposition. The process enables epitaxial deposition of silicon-containing layers over semiconductor surfaces, particularly enabling epitaxial deposition over a silicon germanium base layer. By use of a low-temperature bake, the silicon germanium base layer can be cleaned to facilitate further epitaxial deposition without relaxing the strained crystal structure of the silicon germanium.

4 Claims, 6 Drawing Sheets

U.S. PATENT DOCUMENTS

| | | | | | |
|---|---|---|---|---|---|
| 5,422,502 | A | 6/1995 | Kovacic | | |
| 5,425,842 | A | 6/1995 | Zijlstra | | |
| 5,470,799 | A | 11/1995 | Itoh et al. | | |
| 5,496,745 | A | 3/1996 | Ryum et al. | | |
| 5,508,536 | A | 4/1996 | Twynam et al. | | |
| 5,512,772 | A | 4/1996 | Maeda et al. | | |
| 5,517,943 | A | 5/1996 | Takahashi | | |
| 5,557,117 | A | 9/1996 | Matsuoka et al. | | |
| 5,557,118 | A | 9/1996 | Hashimoto | | |
| 5,609,721 | A | 3/1997 | Tsukune et al. | | |
| 5,670,801 | A | 9/1997 | Nakano | | |
| 5,693,147 | A | 12/1997 | Ward et al. | | |
| 5,729,033 | A | 3/1998 | Hafizi | | |
| 5,783,495 | A | 7/1998 | Li et al. | | |
| 5,859,447 | A | 1/1999 | Yang et al. | | |
| 5,899,752 | A | 5/1999 | Hey et al. | | |
| 5,926,743 | A | 7/1999 | Xi et al. | | |
| 5,986,287 | A | 11/1999 | Eberl et al. | | |
| 5,998,305 | A | 12/1999 | Holmer et al. | | |
| 6,031,255 | A | 2/2000 | Delage et al. | | |
| 6,043,519 | A | 3/2000 | Shealy et al. | | |
| 6,049,098 | A | 4/2000 | Sato | | |
| 6,058,945 | A | 5/2000 | Fujiyama et al. | | |
| 6,060,397 | A | 5/2000 | Seamons et al. | | |
| 6,074,478 | A | * | 6/2000 | Oguro | 117/95 |
| 6,164,295 | A | 12/2000 | Ui et al. | | |
| 6,190,453 | B1 | * | 2/2001 | Boydston et al. | 117/89 |
| 6,221,168 | B1 | 4/2001 | Carter et al. | | |
| 6,316,795 | B1 | 11/2001 | Croke, III | | |
| 6,391,796 | B1 | * | 5/2002 | Akiyama et al. | 438/763 |
| 6,454,854 | B1 | * | 9/2002 | Ose | 117/90 |
| 6,566,279 | B1 | * | 5/2003 | Suemitsu et al. | 438/778 |
| 6,593,211 | B1 | * | 7/2003 | Sato | 438/455 |

OTHER PUBLICATIONS

Wolansky et al., "Low temperature clean for Si/SiGe epitaxy for CMOS integration of heterojunction bipolar transistors," Proceedings of the 8$^{th}$ International Symposium on Silicon Materials Science and Technology, vol. 1, pp. 812-821 (1998).

Wolf et al., "Silicon Epitaxial Growth and Silicon On Insulator," Chapter 7, *Silicon Processing for the VLSI Era*, vol. 1: Process Technology, 2$^{nd}$ Ed., pp. 225-264 (2000).

* cited by examiner

LOW TEMPERATURE LOAD AND BAKE

REFERENCE TO RELATED APPLICATION

The present application claims priority under 35 U.S.C. §119(e) to U.S. provisional patent application No. 60/294,385 filed May 30, 2001.

FIELD OF THE INVENTION

The present invention relates to cleaning semiconductor substrates prior to forming layers thereupon, and more particularly to bake steps and subsequent in-situ epitaxial deposition within a single-wafer chemical vapor deposition (CVD) or atomic level deposition (ALD) chamber.

BACKGROUND OF THE INVENTION

High-temperature ovens, called reactors, are used to create structures of very fine dimensions, such as integrated circuits on semiconductor substrates. One or more substrates, such as silicon wafers (which may or may not include previously formed structures thereon or therein), are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. Various process conditions, particularly temperature uniformity and reactant gas distribution, must be carefully controlled to ensure the high quality of the resulting layers.

Through a series of deposition, doping, photolithography and etch steps, the starting substrate and the subsequent layers are converted into integrated circuits, with a single layer producing from tens to thousands or even millions of integrated devices, depending on the size of the wafer and the complexity of the circuits.

Batch processors have traditionally been employed in the semiconductor industry to allow multiple wafers to be processed simultaneously, thus economically presenting low processing times and costs per wafer. Recent advances in miniaturization and attendant circuit density, however, have lowered tolerances for imperfections in semiconductor processing. Accordingly, single wafer processing reactors have been developed for improved control of deposition conditions.

Among other process parameters, single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. Conversely, any improvements in wafer throughput can translate to significant fabrication cost savings.

One process for which process control is particularly critical, and for which single wafer processing is particularly useful, is the formation of epitaxial layers. If the deposited layer has the same crystallographic structure as the underlying silicon wafer, it is called an epitaxial layer. Through careful control of deposition conditions, reactant gases are passed over a heated substrate such that the deposited species precipitates in conformity with the underlying crystal structure, which is thus extended into the growing layer. The lowest level of devices, including transistors, often include epitaxial layers formed over a single crystal semiconductor substrate.

Cleanliness of the Interfaces Prior to Epitaxial Deposition

It is important that the epitaxial layers maintain a pure crystal structure, free of contamination which could affect device operation. The purity and crystalline structure of the underlying substrate prior to epitaxial deposition strongly affects the resultant epitaxial layer. Contaminants at the substrate surface, such as naturally forming "native oxide" and carbon contaminants, interfere with the crystal structure and consequent electrical properties of each overlying layer as it is formed, resulting in a polycrystalline layer. Note that clean, oxide-free surfaces are also desirable for a number of contexts other than epitaxial deposition.

Typically wafers are cleaned prior to deposition with an ammonium hydroxide, hydrogen peroxide mixture, known as an "APM" clean. The most popular cleaning methods involve one or more forms of an RCA cleaning procedure. The RCA Standard-Clean-1 (SC-1) procedure uses an APM solution and water heated to a temperature of about 70° C. The SC-1 procedure dissolves films and removes Group I and II metals. The Group I and II metals are removed through complexing with the reagents in the SC-1 solution. The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure.

If an oxide-free surface is required, as in the case of epitaxial SiGe stacks, the silicon wafer is typically dipped into an aqueous solution of hydrofluoric acid or HF vapor treated to etch away the oxide layer left by an APM clean and, theoretically, obtain hydrogen termination. There are a large number of variations on RCA clean and hydrofluoric acid treatments. After cleaning, wafers are typically stored for a period of time before further processing. A native oxide tends to form on the previously oxide-free silicon wafer surface almost immediately after exposure to air or moisture. Further, silicon-fluorine and silicon-carbon bonds are often observed on the silicon wafer surface after cleaning. The fluorine and carbon contamination on the surface can be detrimental to the thermal budget and/or the quality of the layer to be grown or deposited on the surface of the wafer.

If the silicon wafer is dipped in hydrofluoric acid as the last cleaning step (also known as an "HF last" step), the surface of the silicon is typically terminated mostly with a monolayer of hydrogen, attached to the substrate largely through Si—H bonds. The hydrogen-terminated surface resists oxidation more than untreated silicon. If desired, the hydrogen termination can be removed at temperatures greater than about 500° C. However, the surface of a silicon wafer after a conventional HF last treatment normally starts to reoxidize within about 20 minutes after the original oxide layer was removed, quickly forming a new 5 Å to 7 Å thick oxide layer on the surface of the silicon wafer. Carbon or fluorine termination can better prevent re-oxidation, though this will introduce other problems, such as contamination or difficulty in removing the termination prior to subsequent processing. The problem of reoxidation after the HF last step has been detrimental to the high-throughput manufacturing of many silicon devices, but has been a particular hindrance in the creation of an epitaxial silicon emitter layer on top of a silicon germanium base.

SUMMARY OF THE INVENTION

A need exists, therefore, for methods of purifying substrate surfaces prior to chemical vapor deposition, and of maintaining the purity of a deposited layer after formation.

Desirably, such methods should be compatible with single-wafer, epitaxial silicon deposition chambers without increasing system costs or reducing wafer throughput. In some arrangements, these methods should not exhaust the thermal budget for SiGe alloys, and subsequent epitaxial layers. Further, there is a need for methods which allow for an increase in both thickness and germanium concentration of the SiGe base layer. These and other needs are satisfied by several embodiments within the present invention.

In accordance with one aspect of the present invention, a method is provided for treating a semiconductor substrate having an exposed semiconductor region subject to oxidation by loading the substrate onto a substrate support in a chemical vapor deposition reaction chamber at less than 550° C.; subjecting the substrate to a bake in a reducing environment for less than 45 seconds; stabilizing the substrate temperature after the bake; and depositing a layer by chemical vapor deposition directly over the semiconductor region after stabilizing the temperature.

In accordance with another aspect of the present invention, a system for chemical vapor deposition on a semiconductor is provided, including: a cold wall reaction chamber; a plasma source connected to the reaction chamber; a susceptor housed within the reaction chamber; a robot configured to transfer a substrate into and out of the reaction chamber; heating elements; and a computer programmed to control the low-temperature plasma cleaning of the reaction chamber, loading of the substrate, and subsequent deposition.

A third aspect of the invention provides a system for chemical vapor deposition on a semiconductor substrate, including: a plasma source; a susceptor; a robot configured to transfer a hydrogen-terminated substrate into and out of the reaction chamber; heating elements; and a computer programmed to control the low-temperature plasma cleaning of the reaction chamber, loading of the substrate, and subsequent deposition.

In accordance with another aspect of the invention, a method is provided for growing an epitaxial silicon-containing layer on a silicon-germanium layer. The method includes inserting a semiconductor substrate with a silicon-germanium layer into a reaction chamber onto a susceptor housed within the chamber. The substrate is subjected to a bake step, following by epitaxially forming a silicon-containing layer on top of the silicon-germanium layer.

In accordance with still another aspect of the invention, a method is provided for semiconductor processing. A substrate with an exposed semiconductor surface is inserted into a reaction chamber. A bake step is conducted to remove oxide from the semiconductor surface, for a period of less than about 45 seconds. An epitaxial layer is then grown over the single-crystal silicon germanium layer.

BRIEF DESCRIPTION OF THE DRAWINGS

These and other aspects of the invention will be readily apparent to the skilled artisan from the following description and the attached drawings, wherein.

DETAILED DESCRIPTION OF THE PREFERRED EMBODIMENT

Figure 1:
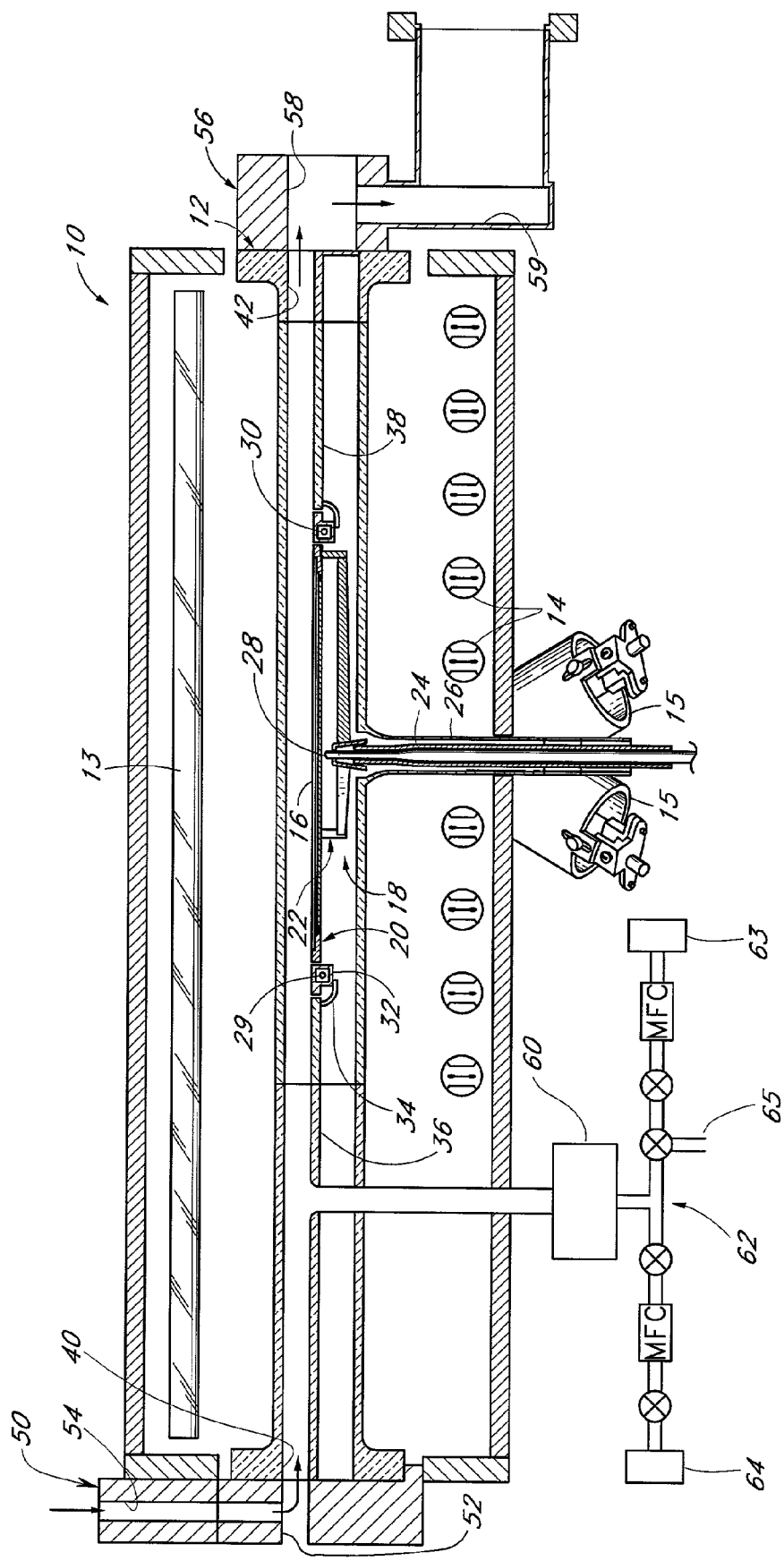
FIG. 1 is a schematic sectional view of an exemplary single-substrate reaction chamber.

While the preferred embodiments of the present invention are discussed in the context of a single-substrate reaction chamber, the skilled artisan will appreciate that the principles and advantages taught herein will have application to deposition reactors of other types. Furthermore, while a series of process steps are disclosed herein, one of ordinary skill in the art will recognize the utility of certain of the disclosed steps even in the absence of some of the other disclosed steps.

A system and methods are provided for low temperature, rapid baking to remove impurities from a semiconductor surface prior to in-situ deposition. Advantageously, a short, low temperature process consumes very little of the thermal budget, such that the process is suitable for advanced, high density circuits with pre-fabricated, shallow junctions and epitaxial SiGe alloys. Furthermore, throughput is greatly improved by a low temperature bake, particularly in combination with low temperature plasma cleaning and low temperature wafer loading prior to the bake, and deposition after the bake at temperatures lower than conventional epitaxial deposition. Although the preferred embodiment for the present invention is illustrated with reference primarily to chemical vapor deposition (CVD), one skilled in the art will understand that atomic layer deposition (ALD) would also be suitable.

In the preferred embodiment, a substrate is loaded on a substrate support that idles at less than the temperature at which protective termination (e.g., hydrogen) desorbs, such as less than about 500–550° C. for hydrogen terminations left by HF last processes. The hydrogen bake can then be a spike in temperature for less than 30 seconds, 15 seconds in the exemplary embodiment, and the temperature is then quickly stabilized at a temperature suitable for a subsequent in-situ CVD process. For example, selective epitaxy, epitaxial or polycrystalline SiGe, and oxynitride deposition can all be conducted at relatively low temperatures between about 550° C. and 800° C. By reducing the temperature at which the bake and the depositions can take place, a process needs less cooling time between processes, and the throughput of a reaction chamber will consequently be increased. Because the susceptor idles at less than 500° C. between wafers, the chamber can be cleaned with low-temperature plasma. This is particularly advantageous in the creation of heterojunction bipolar transistors (HBTs), and especially, those HBTs comprised of silicon-germanium and epitaxial silicon. Finally, the present invention provides a method whereby a SiGe base can be cleaned and freed of any oxide or carbon, and a silicon-containing emitter can be epitaxially grown on top of the SiGe base, without exceeding the thermal budget of the base or introducing dislocations into its lattice structure.

Preferred Reactor Embodiment

The preferred embodiments are presented in the context of a single-substrate, horizontal flow cold-wall reactor.

"Single wafer" processing tools, in general, demonstrate greater process control and uniformity than traditional batch systems, but do so at the expense of throughput, since only one or at best a handful of substrates can be processed at one time. The illustrated single-pass horizontal flow design also enables laminar flow of reactant gases, with low residence times, which in turn facilitates sequential processing while minimizing reactant interaction with each other and with chamber surfaces. Thus, among other advantages, such a laminar flow enables sequentially flowing reactants that might react with each other. Reactions to be avoided include highly exothermic or explosive reactions, and reactions that produce particulate contamination of the chamber. Additionally, the chamber facilitates rapidly purging the chamber between steps, such as purging the chamber of air and moisture after loading a substrate onto the susceptor.

FIG. 1 shows a chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control to have utility in CVD of a number of different materials. Moreover, the illustrated reactor 10 can safely and cleanly accomplish multiple treatment steps sequentially in the same chamber 12. The basic configuration of the reactor 10 is available commercially under the trade name Epsilon™ from ASM America, Inc. of Phoenix, Ariz.

A plurality of radiant heat sources are supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating. In addition, although the preferred embodiments for the present invention are illustrated with reference primarily to chemical vapor deposition (CVD), one skilled in the art will understand that atomic layer deposition (ALD) would also be suitable.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

In the illustrated embodiment, elongated tube-type radiant heating elements 13, 14 are preferable because these elements have the desirable properties of being able to heat up and cool down relatively quickly. Preferably, the upper heating elements 13 and lower heating elements 14 are able to be controlled independently. However, as will be apparent to one skilled in the art, in other embodiments alternate heating sources may be used.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

The substrate holder 20 of the preferred cold wall reactor 10 is a susceptor for radiant heat energy. Typical susceptors comprise SiC or SiC-coated graphite, and in the illustrated embodiment the susceptor 20 includes a pocket sized to fit a 200-mm wafer with less than about 1 mm clearance. In other arrangements, the susceptor can be designed (e.g., pocket sized) to support wafers of other sizes. While certain aspects of the process described herein are compatible with low mass susceptors, some aspects are particularly advantageous for standard susceptors, which are considerably more massive than the wafer for which they are designed to support. Such standard susceptors preferably have a thermal mass greater than about 3 times the thermal mass of the wafer 16 to be supported, and more preferably greater than about 5 times the thermal mass of the wafer, and in the illustrated embodiment the susceptor 20 has a thermal mass about 7–8 times the thermal mass of the wafer 16.

A plurality of temperature sensors are positioned in proximity to the wafer 16. The temperature sensors can take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 that depend from a front chamber divider 36 and a rear chamber divider 38. The dividers 36, 38 desirably are formed of quartz. In some arrangements, the downstream divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and the outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully below, and communicates such gases with the slot 52 and the inlet port 40. The inlet 54 can include gas injectors as described in U.S. Pat. No. 5,221,556, issued Hawkins et al., or as described with respect to FIGS. 21–26 in U.S. patent application Ser. No. 08/637,616, filed Apr. 25, 1996, the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The reactor 10 also preferably includes a generator 60 of excited species, preferably positioned upstream from the chamber 10. The excited species generator 60 of the illustrated embodiment comprises a remote plasma generator, including a magnetron power generator and an applicator along a gas line. An exemplary remote plasma generator is available commercially under the trade name TR-850 from Rapid Reactive Radicals Technology (R3T) GmbH of Munich, Germany. In the illustrated embodiment, microwave energy from a magnetron is coupled to a flowing gas in an applicator along a gas line. Plasma source gases 63 are located upstream of the excited species generator 60. As is known in the art, the plasma source gases 63 can comprise reactants, carrier gases, gas tanks, bubblers, etc., depending upon the form and volatility of the reactant species. Each gas line can be provided with a separate mass flow controller (MFC) and valves, to allow selection of relative amounts of carrier and reactant species introduced to the excited species generator 60 and thence into the reaction chamber 12. It will be understood that, in other arrangements, the excited species can be generated within the process chamber. The preferred processes described below, however, do not employ excited species but are rather species of thermal CVD.

Wafers are preferably passed from a handling chamber (not shown), which is isolated from the surrounding environment, through the slot 52 by a pick-up device. The handling chamber and the processing chamber 12 are preferably separated by a gate valve (not shown) such as a standard vertical slit valve or the type disclosed in U.S. Pat. No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Figure 2:
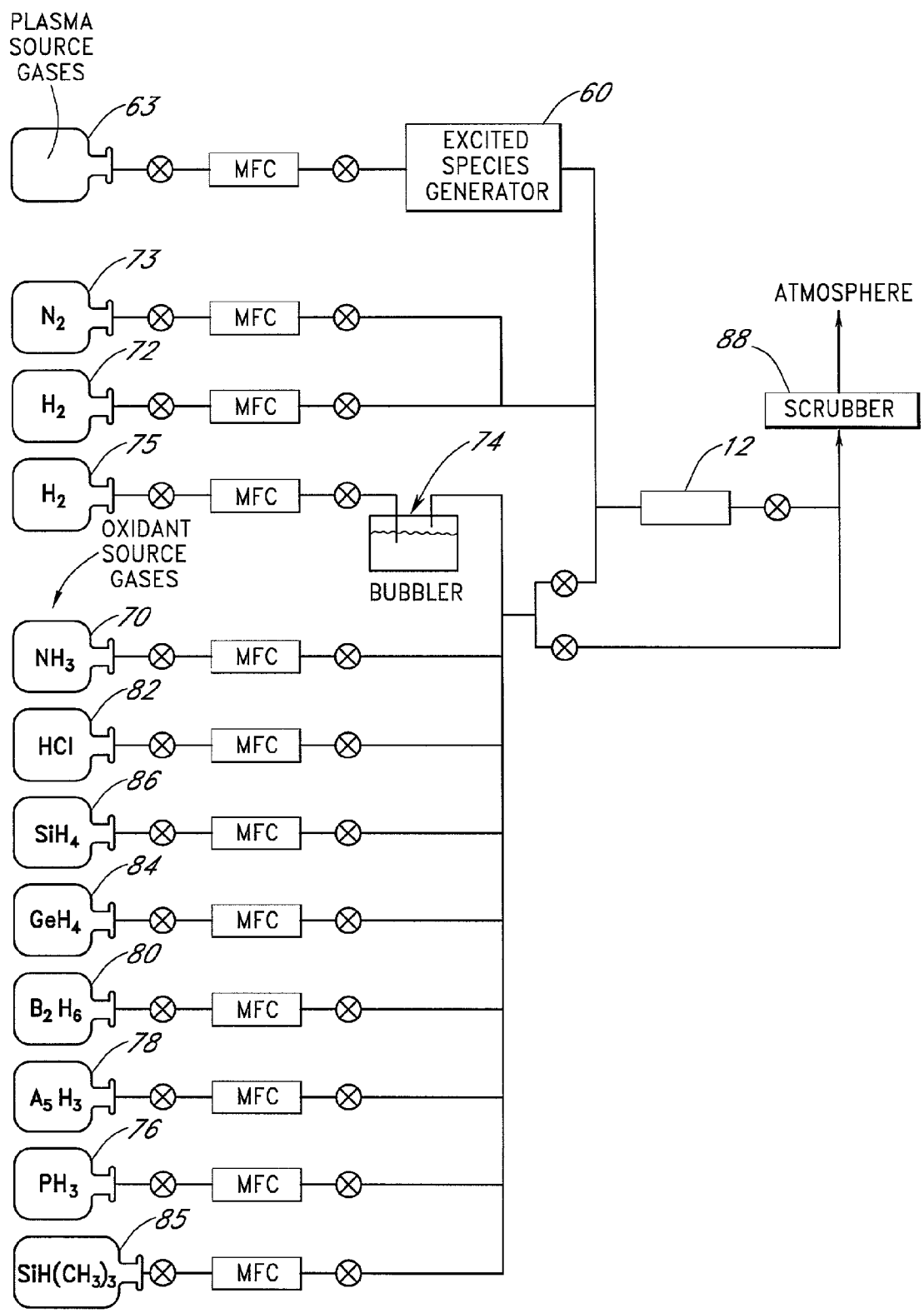
FIG. 2 is a gas flow schematic, illustrating gas sources in accordance with a preferred embodiment of the present invention.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. $H_2$ is also employed as a reducing agent in the preferred hydrogen bake prior to layer formation. In other arrangements, $H_2$ can also flow through the excited species generator 60 to generate H radicals for native oxide cleaning or for other purposes.

The illustrated reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

A liquid reactant source 74 is also shown. The liquid source 74 can comprise, for example, liquid dichlorosilane (DCS), trichlorosilane (TCS) or higher order silane sources in a bubbler, and a gas line for bubbling and carrying vapor phase reactants from the bubbler to the reaction chamber 12. The bubbler can alternatively (or additionally) hold liquid $Ta(OC_2H_5)_5$ as a metal source, while a carrier gas source 75 serves to bubble $H_2$ (shown) or other carrier gas through the liquid source 74 and transport metallorganic precursors to the reaction chamber 12 in gaseous form.

Desirably, the reactor 10 will also include other source gases such as dopant sources (e.g., the illustrated phosphine 76, arsine 78 and diborane 80 sources) and etchants for cleaning the reactor walls and other internal components (e.g., a HCl source 82 or a mixture of $NF_3/Cl_2$ provided as the plasma source gas 63 for feeding the excited species generator 60). For deposition of heteroepitaxy films in accordance with the preferred embodiments, a source of germanium 84 (e.g., germane or $GeH_4$) and a source of carbon 85 (e.g., a SiH(CH$_3$)$_3$ source, a Si(CH$_3$)$_4$ source or a CH$_4$ source) is also provided for doping or formation of SiGe and SiC films.

A silane source 86 is also provided. As is known in the art, silanes, including monosilane (SiH$_4$), DCS and TCS, are common volatile silicon sources for CVD applications, such as the deposition of poly-SiGe, SiC, silicon nitride, metal silicides, and extrinsic or intrinsic silicon (polycrystalline, amorphous or epitaxial, depending upon deposition parameters). Less common sources such as disilane (Si$_2$H$_6$), trisilane (Si$_3$H$_8$) and tetrasilane (Si$_4$H$_{10}$), are also possible. A monosilane (SiH$_4$) source 86 is illustrated.

Additional illustrated source gases include an ammonia (NH$_3$) source 70, which serves as a volatile nitrogen source, useful in CVD and nitridation anneal steps. However, one skilled in the art will understand that the depicted gas sources are merely illustrative, and are not necessary for all embodiments of the claimed invention. Additionally, other gas sources may also be substituted for illustrated gas sources or otherwise added in alternate embodiments.

Each of the gas sources can be connected to the reactor chamber 12 through the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 (FIG. 2) to condense environmentally dangerous fumes before exhausting to the atmosphere.

In addition to the conventional gas sources and liquid bubblers, discussed above, the preferred reactor 10 includes the excited species generator 60 positioned remotely or upstream of the reaction chamber 12. The illustrated generator 60 couples microwave energy to gas flowing in an applicator, where the gas includes reactant precursors from the reactant source 63. For the processes described below, the plasma source gases 63 include a source of fluorine (e.g., NF$_3$, F$_2$ or B$_2$F$_6$), a source of chlorine (e.g., Cl$_2$) other halide sources and/or a source of carrier gas to help support the plasma (e.g., N$_2$, He or Ar). A plasma is ignited within the applicator, and excited species are carried toward the chamber 12. Preferably, of the excited species generated by the generator 60, overly reactive ionic species substantially recombine prior to entry into the chamber 12. On the other hand, electrically neutral excited species such as F, Cl, N or O largely survive to enter the chamber 12 and react as appropriate. As will be clear from the general process discussion below, remote plasma-generated excited species facilitate low temperature chamber cleaning and attendant high wafer throughput when used in combination with the low temperature bake described herein.

Figure 3:
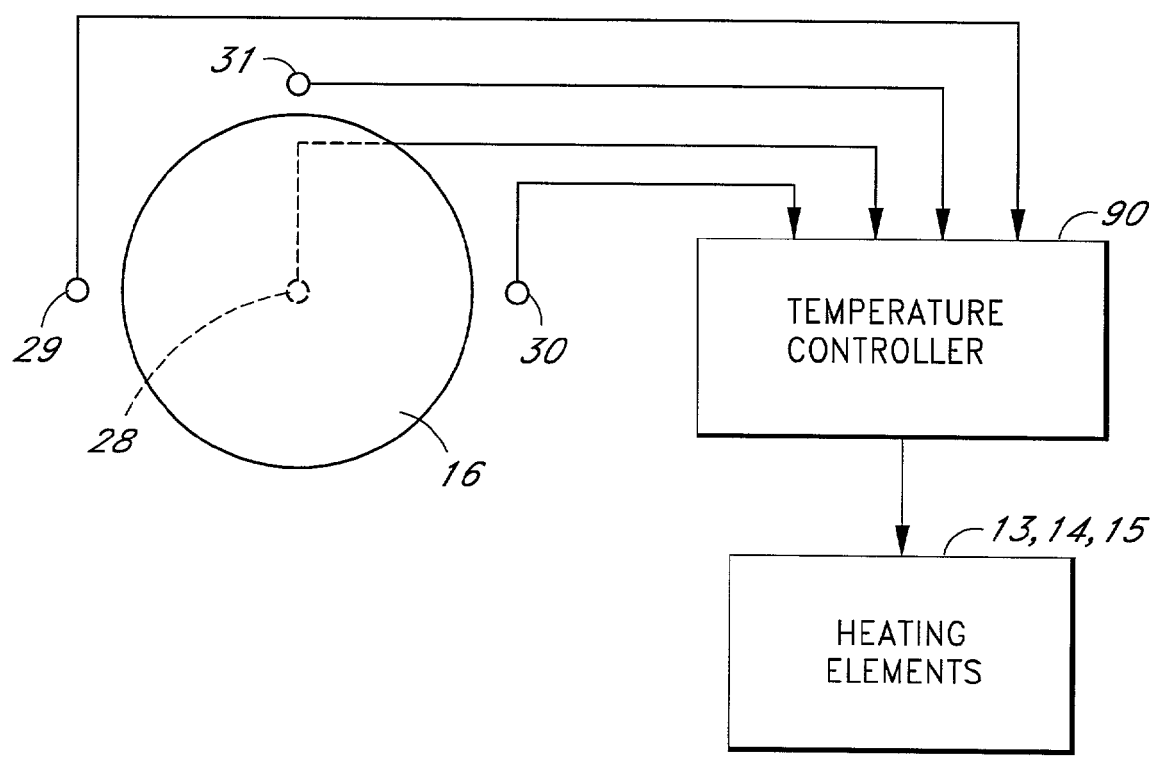
FIG. 3 is a schematic plan view of the wafer in relation to a plurality of temperature sensors and a temperature controller.

With reference to FIG. 3, the wafer 16 is shown in relation to a plurality of temperature sensors, each connected to a temperature controller 90. While illustrated schematically as a single temperature controller 90, the preferred embodiment utilizes four independent temperature controllers for directly controlling the temperatures at four separate temperature sensors. It will be understood by one of skill in this art, however, that the invention can be applied to reactors with any of a number of temperature controllers, such as that disclosed in U.S. Pat. No. 6,207,936 by de Waard et al., entitled "MODEL-BASED PREDICTIVE CONTROL OF THERMAL PROCESSING." Such a temperature controller can predictively control the temperature of a temperature sensor without being limited by the response time of the sensor.

The preferred temperature controller 90, however, comprises independent PID controllers corresponding to the independent temperature sensors. In the preferred embodiment, the temperature sensors comprise the thermocouples 28–31, which indirectly measure temperature by gauging a voltage across a pair of wires forming a junction, as is know in the art of temperature measurement. The Proportional, Integral, and Differential terms are set for each of the PID controllers by a reactor technician. Such controllers are available from The Foxboro Company of Foxboro, Mass., under the designation 761 CNA Single Station Microcontroller. Furthermore, the upper heating elements 13 and lower heating elements 14, 15 are also independently powered.

As will be appreciated by the skilled artisan, the reactor 10 includes a computer (not shown) with a central processing unit and memory storage devices that store programming to control the PID controllers 90, as well as the mass flow controllers. Accordingly, the sequence of gate valve opening/closing, robotic wafer transfer, temperature ramping and gas flow described herein are programmed into the computer for a given process "recipe."

Ex-Situ Wafer Cleaning

As noted in the "Background" section above, the purity of a substrate surface can critically affect the quality of a layer deposited thereon, particularly for epitaxially deposited layers. A common source of contamination of semiconductor substrates is native oxide, which naturally forms on naked silicon surfaces upon exposure to the atmosphere. Carbon contaminants also tend to be found at the surface of semiconductor wafers, as received from wafer suppliers.

Such exposure and contamination is inevitable in transporting wafers from vendors to fabrication facilities, and transporting wafers among processing equipment or tools within a facility. For example, polished silicon wafers are typically provided by independent suppliers. Yet another set of suppliers often obtain wafers, apply epitaxial layers, and furnish these wafers to fabrication facilities. Even when epitaxial layers and later fabrication steps are performed at the same facility, wafers are often exposed to atmospheric contaminants and plastic handling equipment between processing steps in different parts of the facility.

Figure 4:
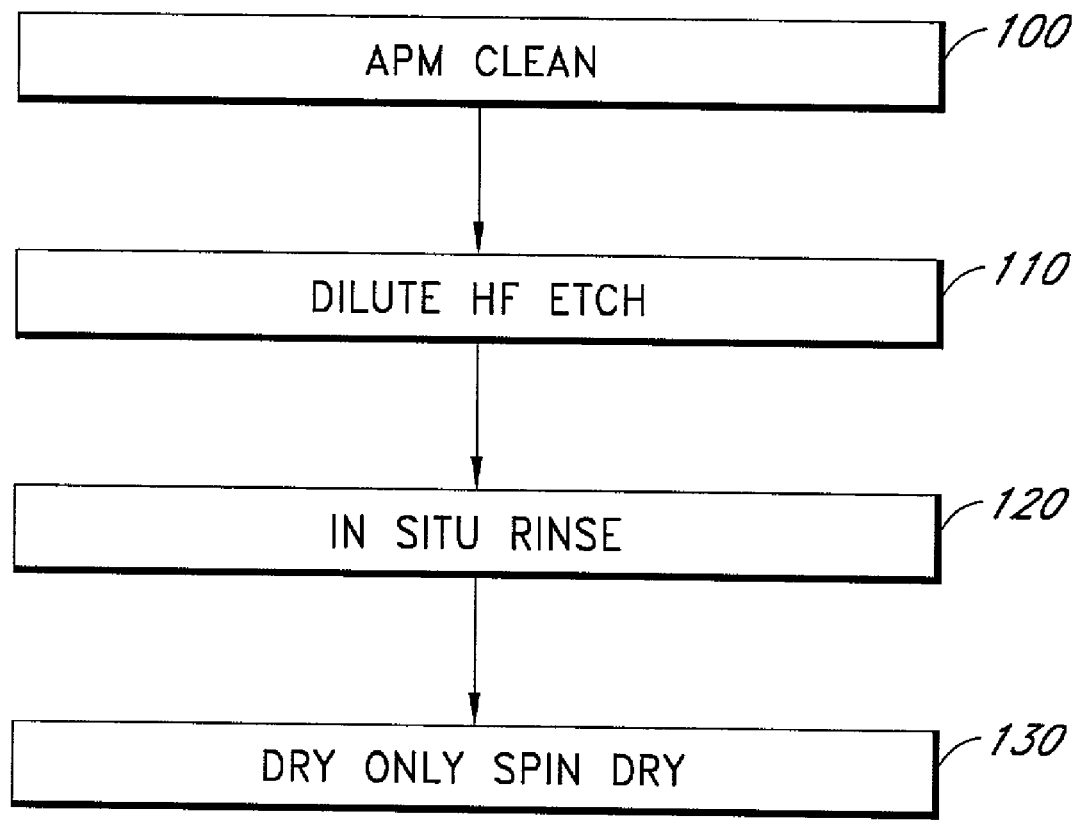
FIG. 4 is a flow chart generally illustrating a preferred method for cleaning a wafer prior to introduction into the process chamber.

Accordingly, with reference to FIG. 4, the wafer is most preferably cleaned in an ex-situ bath prior to loading in the CVD reactor. In some arrangements, part or all of the cleaning process of FIG. 4 can be conducted on a process tool clustered around a common transfer chamber with the CVD reactor. The process of FIG. 4 most preferably employs the particularly optimized cleaning process of co-pending U.S. application Ser. No. 09/817,770, filed Mar. 26, 2001, entitled STABLE, OXIDE-FREE SILICON SURFACE PREPARATION, assigned to the assignee of the present application, the disclosure of which is incorporated herein by reference. The conditions below are taken from the preferred embodiment of the '770 application. The skilled artisan will appreciate, however, that the low temperature bake step of the present disclosure can also be employed following other cleaning processes.

Initially, a substrate with a silicon-containing surface (e.g., a bare silicon wafer or a wafer with a SiGe base formed thereon) to be deposited upon is cleaned 100 with an ammonium hydroxide/hydrogen peroxide mixture (APM). The ammonium hydroxide/hydrogen peroxide cleaning 100 of the preferred embodiment uses a solution of 800 mL to 1,000 mL of 30% hydrogen peroxide, 300 mL to 600 mL of 29% ammonium hydroxide and 11 gallons (41 L) of water. Thus, the total bath concentration is preferably 0.50% to 0.80% by volume ammonium hydroxide, and more preferably 0.58% to 0.73% ammonium hydroxide. The total bath concentration is preferably between about 0.10% to 0.50% hydrogen peroxide, and more preferably about 0.21% to 0.42% hydrogen peroxide. The solution is preferably maintained at a temperature of about 20° C. to 50° C., and more preferably 30° C.–40° C. In the preferred embodiment, the wafer is maintained in the solution for about 5 minutes to 15 minutes. The described APM solution of step 100 of FIG. 4 is similar can be similar to the SC-1 solution of the RCA cleaning process.

The APM cleaning step 100 removes particles, surface defects, and Group I and Group II metals from the silicon wafer in the process of growing a chemical oxide. The APM cleaning can be done in an open vessel etch bath or other suitable vessel. Open vessel etch baths are commercially available. The M&A Recirculating Etch Bath, commercially available from Marks & Associates of Phoenix, Ariz., is an exemplary open vessel etch bath which is suitable for use in the APM cleaning step 100. Other open vessel etch baths are suitable for the APM cleaning step 100. Furthermore, the APM cleaning step 100 is not limited to open vessel etch baths.

A dilute hydrofluoric (dHF) acid etch step 110, as shown in FIG. 4, is performed after the APM cleaning step 100. An oxide layer is present on the surface of the silicon wafer after the APM cleaning step 100. The dilute hydrofluoric acid etch step 110 removes the oxide layer from the silicon wafer.

The dilute hydrofluoric acid for the dilute hydrofluoric etch step 110 preferably has a concentration of approximately 0.5% to 1.0% by weight (wt %) hydrogen fluoride, and more preferably 0.5 wt. % HF. Use of a dilute hydrofluoric acid for the etch step 110 minimizes contamination on the surface of the silicon wafer. The dilute hydrofluoric acid is preferably heated to a temperature of about 35° C. to 60° C., and more preferably at about 50° C., to minimize particles and to enhance hydrogen termination on the surface of the silicon wafer. The heated dilute hydrofluoric acid etch also provides for uniform oxide etch rates on the entire surface of the silicon wafer. The silicon wafer is preferably exposed to the dilute hydrofluoric acid etch for a time period of between about 20 seconds and 2 minutes, more preferably for a time period of between about 40 seconds and 60 seconds, and most preferably for a time period of approximately 60 seconds. In an exemplary procedure, the silicon wafer is etched with dilute hydrofluoric acid having a concentration of approximately 0.5 wt % hydrogen fluoride at a temperature of approximately 50° C. for approximately 60 seconds.

Preferably, the substrate is dipped in an aqueous or wet HF bath, although the skilled artisan will appreciate that HF vapor can also be employed in other arrangements. The ultrapure water which is used to form the dilute hydrofluoric acid in the etch bath has high resistivity, indicating that the metals levels are low. The water which is used to form the dilute hydrofluoric acid in the etch bath has a resistivity greater than about 15 megaohms-cm (MΩ-cm) at a temperature of 25° C., and most preferably a resistivity of at least about 18 MΩ-cm. The total organic carbon (TOC) and the dissolved silica are also preferably minimized to levels of less than 10 ppb (parts per billion).

The hydrofluoric acid which is used to form the dilute hydrofluoric acid in the etch bath is preferably gigabit grade (on the order of parts per trillion impurities) hydrofluoric acid with low levels of particles and dissolved metals, commercially available as Part No. 107101 in a 49% solution from Alameda Chemical of Tempe, Ariz., (480) 785-4685.

In the preferred embodiments, a high purity nitrogen purge curtain is employed at the air/liquid interface during both the dilute hydrofluoric acid etch step 110 and the subsequent in-situ rinse step 120. The high purity nitrogen is filtered through a filter, which removes particles larger than 0.003 μm at the point of use. Ionizing the nitrogen before the nitrogen contacts the silicon wafer minimizes particles. An ionizer, for example, is part of the Verteq SRD™ system. The high purity nitrogen enhances particle neutrality and stable surface termination on the silicon wafer.

After the silicon wafer is etched with dilute hydrofluoric acid in step 110, the silicon wafer is rinsed in-situ in the etch bath with ultrapure water for maximum hydrogen passivation of the etched silicon surface in the in-situ rinse step 120 of FIG. 4. The ultrapure water which is used for the in-situ rinse step 120 desirably has the same purity as the ultrapure water which is used to form the dilute hydrofluoric acid in the etch bath to maintain stable hydrogen termination and particle neutrality. The etched silicon wafer is preferably rinsed with ultrapure water for a time period sufficient to remove all HF acid and particles from the previous etch step, which of course depends upon the volume of the etch bath.

Rinsing the silicon wafer in-situ in the etch bath minimizes the amount of contamination. Furthermore, the in-situ rinse step 120 eliminates a step of transferring the wafer into a rinse bath. Contamination of the silicon wafer could occur during the transfer to the rinse bath. In the illustrated embodiment, the in-situ rinse step 120 is conducted at approximately room temperature (typically 20° C.–25° C., or about 23° C.). The in-situ rinse is preferably a cascade and displacement rinse. An exemplary in-situ rinse step 120 involves an in-situ rinse in the etch bath with ultrapure water at room temperature for approximately 15 minutes.

After the silicon wafer is rinsed with ultrapure water, it is dried in the spin-dry step 130 of FIG. 4. Although a variety of spin-drying apparatuses are suitable for the drying step 130, the Verteq 1800 is an exemplary spin/rinse dryer, commercially available from Verteq, Inc. of Santa Ana, Calif. The silicon wafer is transferred to the spin/rinse dryer after rinsing in the in-situ rinse step 120. In the spin-only dry step 130, the silicon wafers are spun dry while hot, ionized nitrogen is flowed into the dryer at a rate of between about 15 slm and 25 slm. The hot nitrogen gas is preferably at a temperature of 60° C. to 80° C., more preferably at a temperature of 60° C. to 80° C., and most preferably at a temperature of about 70° C. Only the dry cycle is carried out, preferably at 400 rpm to 600 rpm, without using the rinse cycle of the machine. The nitrogen stream is passed through a filter, which removes particles larger than 0.003 μm before entering the dryer. The dry only spin-dry step 130 is carried out until the silicon wafers are dry, typically approximately 240 seconds for bare silicon wafers and approximately 480 seconds for patterned wafers. The dry only spin-dry step 130 enhances particle neutrality and stable surface termination on the silicon wafer.

An exemplary dry only spin-dry step 130 is conducted at 500 rpm for 240 seconds for a bare silicon wafer or 480 seconds for a patterned silicon wafer with the heater on and antistatic option (ionization) on.

Advantageously, the process described herein produces a low particulate count and a hydrogen termination that can remain stable under clean room conditions for days, in contrast to conventional cleaning processes that result in oxidation within about 20 minutes. Conventional cleaning can, however, be used in conjunction with the processes described below; in this case it is preferred to conduct such cleaning, or at least the HF last treatment, immediately prior to initiating the process of FIG. 5.

Low Temperature Bake, Deposition and Chamber Cleaning

Figure 5:
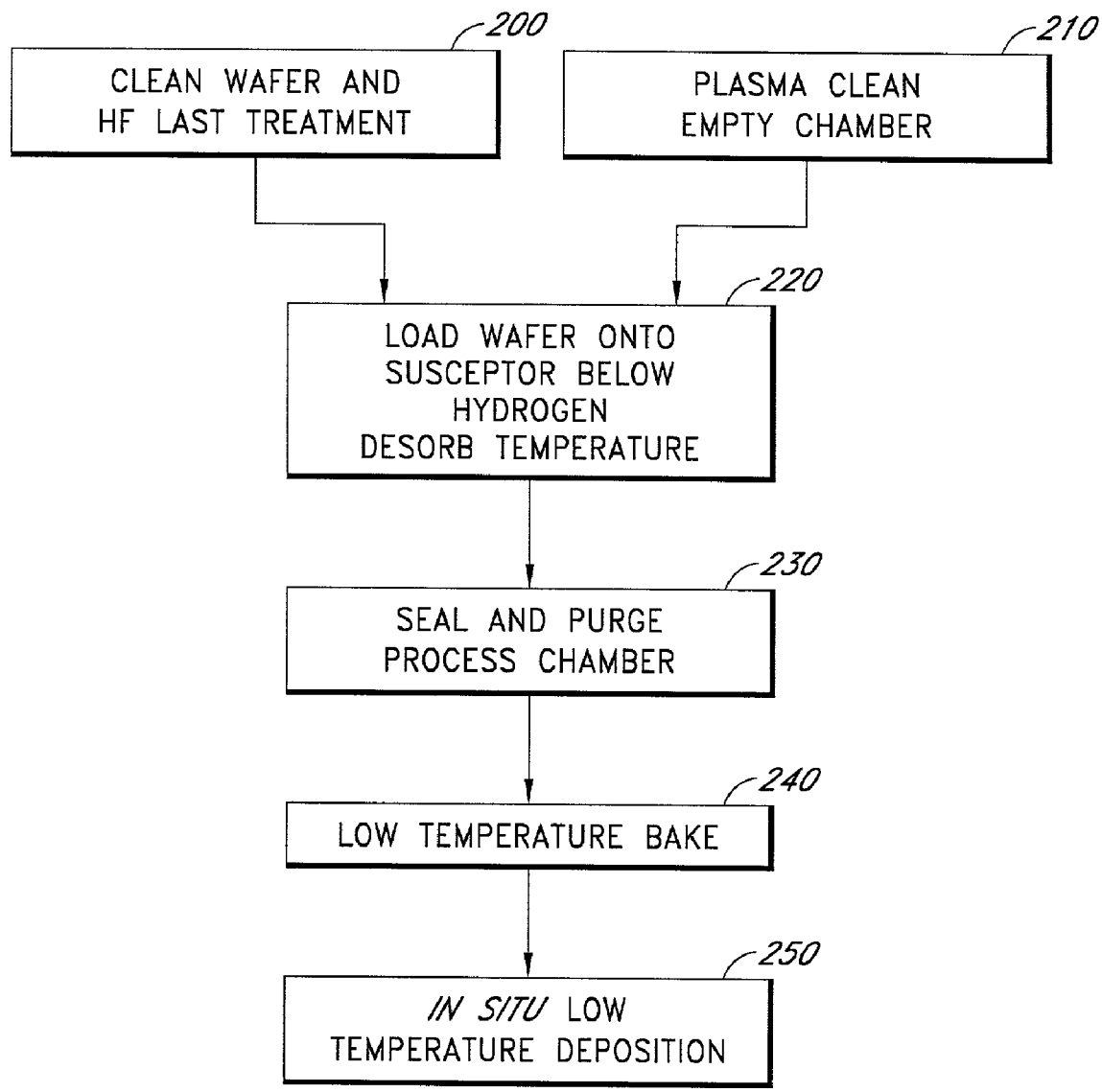
FIG. 5 is a flow chart generally showing a process in accordance with the preferred embodiments.

Referring now to FIG. 5, the process of FIG. 4 is illustrated as a step 200 and occurs prior to loading 220 wafers in the preferred CVD chamber.

Residue from silicon source gases is generally left on surfaces of the reaction chamber 12 (FIG. 1) after the deposition. In the past, such residues have been removed with simple HCl vapor etch steps between depositions. Without frequent cleaning, the residue can cloud the quartz reactor walls through which radiant heat must pass for normal operation. Exposing the residue to an oxidation step before the etch step, however, tends to harden the residue, requiring more harmful or costly cleaning steps. Ex-situ acid washing the coated surfaces, for example, entails considerable costs in dismantling the process chamber, not to mention the costs of reactor down time during ex-situ cleaning of reactor components.

While the chamber is empty of wafers, advantage can be taken of a low temperature plasma clean process 210, to remove deposits from the chamber walls and other components. The clean process 210 can be conducted after every deposition cycle (between wafers) or can be conducted after every few wafers. Preferably, the clean process 210 employs halide source gases (particularly $NF_3$ and/or $CF_6$) activated in the remote excited species generator 60 (FIG. 2). Preferably, the clean process is conducted at less than about 550° C., more preferably less than about 500° C., and most preferably at about 450° C. Following a plasma chamber clean 210, the reactants are purged from the chamber and the gate valve is opened.

As will be appreciated from the discussion below, the low temperature loading 220 of wafers and low temperature bake step 240 permit taking full advantage of the low temperatures afforded by plasma energy during the chamber clean 210. Without the low temperature loading process 220, which is facilitated by the subsequent low temperature bake 240, the chamber temperature would at any rate need to be ramped up to a higher bake temperature.

After the plasma chamber clean 210, the wafer is loaded 220 into the process chamber and onto the wafer support or susceptor 20 (FIG. 1). In the preferred embodiment, the susceptor 20 "idles" between wafer processing at less than the temperature at which the protective termination on the wafer desorbs. For example, following an HF last process that leaves a hydrogen termination, the susceptor 20 idles at less than 550° C., preferably less than about 500° C., and in the exemplary embodiment at about 450° C. Accordingly, the susceptor 20 is maintained at the temperature of the preceding plasma clean 210 during loading 220 in the illustrated embodiment.

Advantageously, the low temperature loading 220 largely maintains the hydrogen termination on the wafer surface until after the chamber gate valve is closed and chamber purging 230 begins to remove any atmospheric contaminants which can have been introduced through the gate valve during loading of the substrate. Purging can be performed with any suitable purge gas, but is most preferably conducted with hydrogen gas. Desirably, $H_2$ is flowed from the inlet port 40 to the outlet port 42, as well as through the depending tube 26 to the underside of the wafer holder 20 (see FIG. 1). Exemplary $H_2$ flow rates are within about 20–45 slm.

Due to the low wafer temperature at this stage, air and moisture is removed from the chamber before substantial loss of the hydrogen termination, and minimal oxidation of the wafer surface occurs. Additionally, the low temperature loading 220 reduces damage to wafers, wafer handling robot end effectors and susceptors by reducing the advent of wafer "curl." Wafer curl is a well-known phenomenon resulting from thermal shock of bringing a relatively cold wafer into sudden contact with a much hotter wafer support. Moreover, in combination with the low temperature plasma clean 210 and low temperature bake 240 (discussed below), low temperature loading can significantly improve wafer throughput.

After purging 230, the low temperature bake 240 is conducted. Having maintained the protective termination until purging 230 the chamber, relatively little contamination needs to be removed, such that the bake step need not be as high in temperature nor as prolonged as conventional bake steps. Furthermore, extremely rapid temperature ramping can be conducted without fear of exacerbating the native oxide problem, since the chamber is largely free of oxygen and moisture at the time of ramping. Accordingly, the low temperature bake 240 preferably involves quickly ramping the wafer temperature for less than about 45 seconds, more preferably less than about 30 seconds, and most preferably for less than about 20 seconds. In an exemplary embodiment, wherein a 200-mm wafer was employed, temperature ramping proceeds for only about 15 seconds before stabilizing the temperature for the subsequent deposition. The skilled artisan will readily appreciate, in view of the disclosure herein, that the temperature ramping time can be adjusted for different wafer sizes and lamp power.

Advantageously, this low temperature bake 240 leaves very low levels of oxygen and carbon contamination at the surface. Experiments using the SIMS analytical technique indicate less than $10^{18}$ atoms/cm$^3$ of oxygen at the interface between the silicon surface and subsequently deposited layer. These results are achieved with very low consumption of thermal budget (low temperatures and time), desirably without adding halide etch species to the bake process. If desired, in some arrangements, metal impurities can also be removed if HCl is added to the low temperature bake process 240.

As illustrated, the low temperature bake 240 is preferably followed in-situ by a low temperature deposition 250, which are discussed in more detail below. "Low temperature," as used to describe the deposition 250, refers to processes conducted at below conventional epitaxial silicon deposition temperatures. Accordingly, the wafer does not need to be heated further after the bake step and typically needs to be lowered.

Accordingly, to maximize throughput under such conditions, the low temperature bake 240 is conducted in a manner that minimizes the time to stabilize at the temperature desired for the deposition 250. Accordingly, the rapid temperature ramp is conducted by providing biased power to the upper lamps 13 (see FIG. 1), relative to the power provided to the lower lamps 14 (FIG. 1). For example, in an exemplary bake 240, the power provided to the upper lamps is preferably more than about 25% higher, and more preferably about 50% higher than a "neutral" analog ratio of upper lamp power to lower lamp power, where "neutral" refers to the ratio optimized to achieve equal wafer 16 and susceptor 20 temperatures. At an analog ratio of 50% above neutral for the exemplary ramp in the exemplary reactor 10, the upper lamps 13 are at full power. Thus, the wafer is rapidly heated during the low temperature bake 240, but the more massive susceptor 20 does not heat as rapidly and therefore does not require much time to drop in temperature and then stabilize at the deposition temperature.

In experiments, it was found that the center thermocouple 28 (FIG. 1) reached only a peak temperature of about 684° C. during a 15 second power spike to the top lamps. The center thermocouple 28, which reacts rather slowly and is spaced from the wafer, does not reflect actual wafer temperature during this rapid spike; the actual peak wafer temperature is between about 700° C. and 900° C., preferably between about 750° C. and 800° C. The wafer temperature is not, however, stabilized at this peak temperature; rather, after the low temperature bake, during which power is biased toward the top lamps 13 (FIG. 1) and the wafer temperature is constantly ramped upward, the temperature controllers are immediately adjusted to stabilize the wafer at the deposition temperature. The substrate holder 20, however, preferably reaches less than 750° C., preferably less than about 725° C. and in the exemplary embodiment less than about 700° C.

As noted, the deposition 250 is conducted at lower than standard epitaxial silicon processes. Preferably the wafer temperature is between about 450° C. and 950° C., more preferably between about 550° C. and 800° C., and most preferably between about 600° C. and 700° C. Due in part to the low maximum temperature and rapidity of the bake 240, temperatures preferably stabilize at the desired deposition temperature in less than 1 minute after the temperature ramp, preferably less than about 45 seconds after the bake 240. In an exemplary process, temperature stability at 650° C. is reached in 45 seconds, including the bake step 240. In contrast, lowering the temperature for this system from a traditional bake temperature of 900° C. to 650° C. ordinarily takes about 2 minutes, not including the bake time.

Low temperature deposition 250 on the clean silicon surface can be one of a number of possible processes. For example, selective epitaxial silicon deposition is conducted between about 650° C. and 1000° C. Such a process is of particular utility for circuit designs calling for elevated source/drain regions or elevated emitters. SiGe deposition is preferably conducted between about 625° C. and 725° C. Epitaxial silicon deposition upon a SiGe base or CVD of silicon oxynitride ($SiO_xN_y$) can also be conducted in similar ranges, e.g., at about 650° C. The skilled artisan will readily appreciate precursors and conditions suitable for such post-bake low temperature deposition processes.

Following the deposition 250, the temperature of the wafer 16 and susceptor 20 is allowed to fall to idling temperature while the gate valve is opened, the wafer 16 is removed, the gate valve is closed, and plasma chamber cleaning 210 is again commenced. In the case that a SiGe base was deposited upon the wafer 16, additional processing of the wafer 16 can now take place before the wafer 16 is returned for epitaxial growth of a silicon emitter. Alternatively, another wafer is then introduced and loaded 220 onto the susceptor 20 at a low temperature, and the process is repeated.

In the preferred embodiment, a recipe is entered into the processor of the reactor 10 and temperature controllers (not illustrated) are programmed with target temperature goals with which to determine heating element power allocation. As an example of the previous description, the following exemplary recipe is provided for conducting a low temperature bake: First, a plasma chamber clean is conducted. Second, the wafer 16 is loaded into the process chamber 12 and onto the wafer support or susceptor 20 while hydrogen is supplied to the chamber at 10 slm and with the temperature controller set at 350° C. Third, the chamber 12 is sealed and hydrogen gas is supplied to the process chamber at 20 slm while the temperature controller is set to 450° C. Fourth, the chamber 12 is pumped down to 0.8 atmospheres. Fifth, the temperature controllers are set to 1100° C., corresponding with maximum power being sent to the heating elements, and a bake is conducted for 15 seconds. It is important to note that, while the temperature controllers are seeking to achieve 1100° C., neither the chamber temperature, nor the substrate ever actually approach that temperature, generally staying in the 700° C. to 900° C. range. Sixth, a backfill step is conducted while the temperature controllers are set to 680° C., hydrogen flow is increased to 45 slm, and pressure is increased to 1 atmosphere. Thereafter, deposition takes place, as described above.

Problems Inherent in Formation of Epitaxial Layers and Heterojunction Bipolar Transistors As is known in the art, epitaxial layers can be formed of intrinsic or doped silicon, silicon germanium, or other semiconductor materials. Recently, the benefits of integrated devices, with an epitaxial silicon-germanium base and an epitaxial silicon emitter have become increasingly apparent. In particular, such materials are very desirable for use in high frequency applications and are particularly important in the creation of heterojunction bipolar transistors.

Heterojunction bipolar transistors (HBTs) are high frequency transistors in which the emitter can be formed with epitaxial silicon and the base can be comprised of an epitaxial silicon-germanium alloy. Silicon-germanium alloy (often expressed simply as silicon-germanium) is narrower in band gap than silicon. As the vertical dimensions of the common bipolar transistor are reduced, the properties of the SiGe HBTs make them increasingly desirable.

The use of silicon-germanium for the base of a heterojunction bipolar transistor can enhance the efficiency of carrier injection from the emitter into the base. Consequently, current gain "g" attains a sufficient level even if the impurity concentration in the silicon-germanium base is higher than that in a conventional silicon base by more than one order of magnitude. With a silicon-germanium base, high performance at high frequencies can be realized by sufficiently raising the doping level in the base and reducing the base width. Furthermore, there is a possibility of improving the cut-off frequency (shortening the emitter-base diffusion time) and, consequentially, further enhancing the high-frequency characteristics by grading the germanium profile in the silicon-germanium base. The advanced silicon-germanium bipolar complementary metal-oxide-semiconductor (BiCMOS) technology uses a silicon-germanium base in a heterojunction bipolar transistor. In the high frequency (such as multi-GHz) regime, conventional compound semiconductors such as GaAs and InP currently dominate the market for high speed wired and wireless communications. Silicon-germanium BiCMOS promises not only a comparable performance to GaAs in devices such as power amplifiers, but also a substantial cost reduction due to the integration of heterojunction bipolar transistors with standard CMOS, yielding the so-called "system on a chip."

One disadvantage of SiGe base layers is that it is quite difficult to form defect free epitaxial emitter layers on a SiGe base layer. Typically, in order to minimize any cross-contamination between processes due to memory effects within chambers, SiGe base layers are formed in a different chamber from the processes for forming the underlying collector and overlying emitter layers. Unfortunately, this provides an opportunity for oxide and other contaminants to affect the top surface of the SiGe layer. Under conventional processes, a high temperature bake would intolerably relax the crystal structure of the SiGe base layer. The skilled artisan will appreciate that the thermal budget that a SiGe layer can tolerate depends upon whether it is formed as a metastable layer. Accordingly, in order to obtain epitaxial deposition over the SiGe base layer, ordinarily care must be taken to avoid contamination after the SiGe layer has been formed. Although epitaxial layers over SiGe have been fabricated in reaction chambers where the complete HBT structure is grown without interruption, this is not practical for most integration schemes. Thus, the sensitive collector-base or base-emitter interfaces are never exposed to air or other process environments, unlike devices which employ a selectively grown epitaxial base and a polysilicon emitter. For a detailed description of the prior art, please see "Low 1/f noise SiGe HBTs with application to low phase noise microwave oscillators." Gruhle and Mahner, Electronics Letters, Nov. 20, 1997, pp. 2050–2052. See also, "Prospects for 200 GHz on Silicon with SiGe Heterojunction Bipolar Transistors." Gruhle, IEEE BCTM 1.1, August, 2001, pp. 19–24.

Currently, there are four major issues which must be considered when attempting to fabricate SiGe HBTs: first, the cleanliness of the interfaces prior to epitaxial deposition; second, the thermal budget and lattice structure preservation necessary for epitaxial emitter growth; third, the concentration of germanium in the base; and fourth, the thickness of the base. Each of these issues is addressed through embodiments of the present invention.

Cleanliness of the Interfaces Prior to Epitaxial Deposition

After a silicon germanium base has been grown on a silicon substrate, it would be desirable to grow a silicon-containing emitter epitaxially on top of that SiGe base. In order to avoid process cross-contamination, it is desirable to deposit the silicon-germanium base on the silicon substrate in one reaction chamber, whereafter the wafer can be removed from that reaction chamber and further processed before the silicon emitter is grown. During the period between base and emitter deposition, oxide and carbon contaminants develop upon the surface of the SiGe base, thereby preventing epitaxial growth of a silicon emitter. Even a very small contamination upon a silicon germanium base can impede the formation of an epitaxial emitter. Apart from achieving epitaxial deposition, other processes, such as transistor gate dielectric formation, require a clean surface prior to film formation.

Thermal Budget and Lattice Structure

Even after a substrate has been properly cleaned, it has remained a major challenge to deposit and maintain a high quality silicon-germanium film on the substrate. It is well known that germanium has a constant about 4% larger than the lattice constant of silicon. When silicon-germanium is grown on a silicon substrate, silicon-germanium will experience a compressive strain due to the lattice mismatch between the silicon-germanium alloy and the silicon substrate. As the temperature of the substrate increases, the energy of the misfit strain increases such that it becomes energetically favorable for dislocations to generate in the alloy film. These dislocations are detrimental to device performance, especially for bipolar devices, leading to high leakage current and low voltages. In addition, crystal dislocations in the base layer are propagated through to the emitter layer, preventing the formation of epitaxial emitters. This effect has prevented the widespread adoption of epitaxial emitters upon silicon germanium bases, and has forced manufacturers to produce primarily devices whose emitters were polycrystalline in nature. Consequently, there is a particular need for a method of creating epitaxial emitters on silicon-germanium bases which minimizes such dislocations.

Even with the HF last treatment, epitaxial and other depositions over silicon-containing structures typically employ a pre-deposition bake step to remove any native oxide. Such bake steps, usually employing hydrogen as a reducing agent and therefore referred to as "hydrogen bake" steps, are typically conducted at relatively high temperatures for extended periods of time. Typical bake conditions range from 750° C. for about 20 minutes to 900° C. for about 1 minute. Even higher temperatures (1000° C. to 1200° C.) are often employed for baking in conjunction with a subsequent high temperature epitaxial process. Such bake steps, however, reduce wafer throughput due to the time required for the bake step itself or for temperature cycling. In addition, such extended, high temperature bakes consume an unacceptable amount of thermal budget for devices with shallow junctions, causing uncontrolled migration of dopants in the semiconductor substrate. Accordingly, thermal budget consumption is disadvantageous for bake steps in all contexts, but is particularly disadvantageous for cleaning SiGe base layer surfaces, which, as noted above, become excessively relaxed when exposed to high temperatures for a long period of time.

In attempts to reduce the temperature and thermal load from bake steps, it has been suggested to add halide gases or other etchant vapors and/or plasma energy to the bake process. While acceptable for some circuit designs, such etch chemistries can be detrimental to the wafer.

Consequently, there is a need for a process which will allow for removal of the hydrogen termination in a contaminant free environment while minimizing the consumption of the thermal budget, and thereby prevent dislocations, in a SiGe base.

Germanium Concentration

In forming a SiGe base, the germanium concentration decreases linearly from the collector-base interface to the base-emitter interface. In an exemplary arrangement, the concentration of germanium within this gradient ranges from 20% at the collector-base interface to 0% at the base-emitter interface. Because increased germanium concentration also increases stress on the lattice structure of an epitaxially grown SiGe alloy, it is inversely proportional to the thermal budget which a given SiGe layer can withstand; the higher the Ge-content, the more easily the SiGe crystal structure is relaxed. Electrically, it is desirable to increase the concentration of germanium in the base, but doing so decreases the thermal budget for a given device. Similarly, for a given thermal budget, only a certain germanium concentration can be present in a device. Consequently, there is a need for a process which allows for an increase in germanium concentration in the base layer while minimizing the consumption of the thermal budget.

SiGe Base Thickness

Typically, a SiGe base ranges from 250 Å to 650 Å in thickness. Because increased germanium thickness also increases stress on the lattice structure of an epitaxially grown SiGe alloy, it is inversely proportional to the thermal budget which a given SiGe layer can withstand; the thicker the SiGe layer, the more easily its crystal structure relaxes.

Similarly, for a given thermal budget, only a certain germanium thickness is possible. Consequently, there is a need for a process which allows for an increase in germanium thickness in the base layer while minimizing the consumption of the thermal budget.

Figure 6:
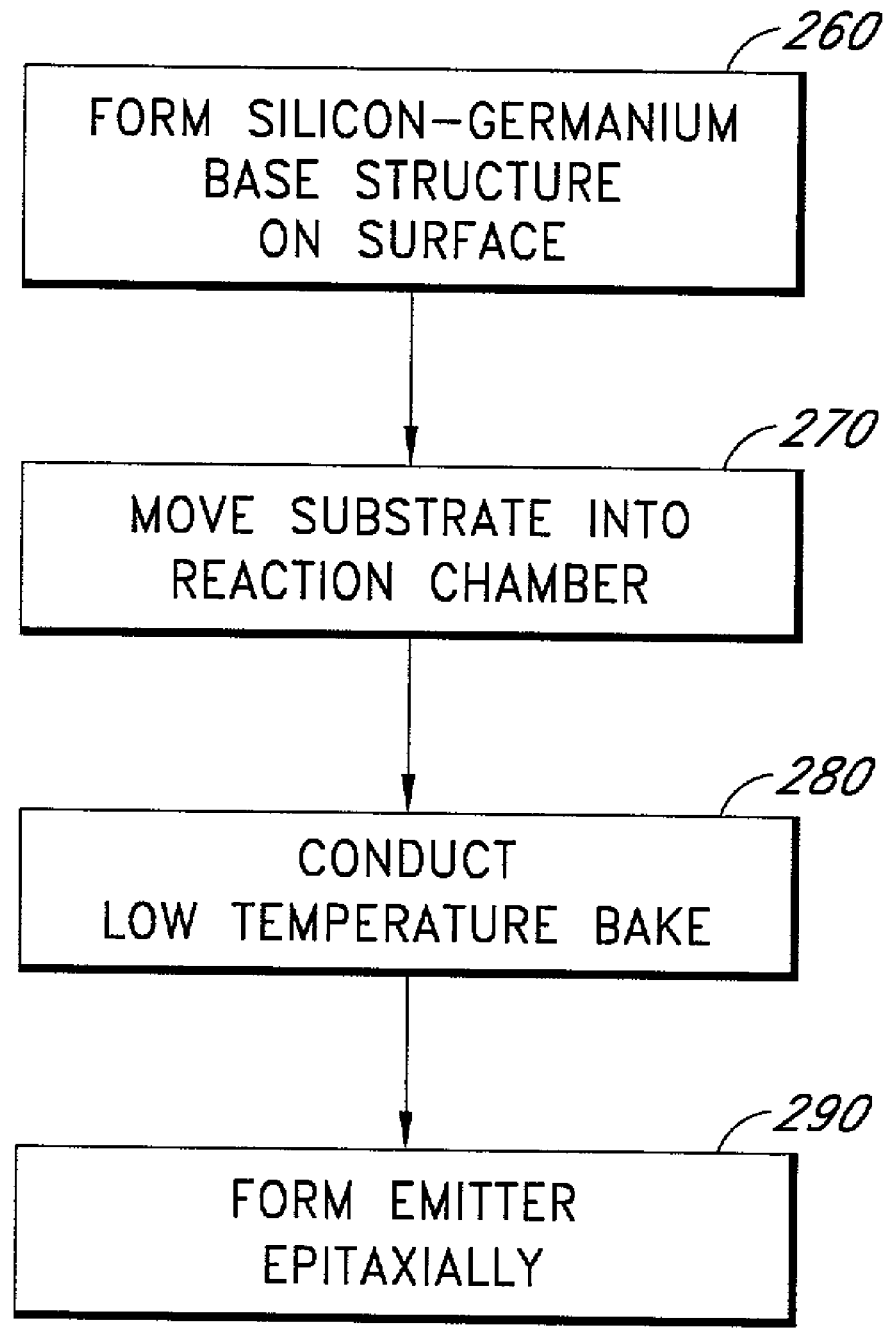
FIG. 6 is a flow chart generally showing a process for forming an epitaxial emitter in accordance with the preferred embodiments.

Preferred Method of Forming of Epitaxial Layers and Heterojunction Bipolar Transistors After a layer of epitaxial SiGe alloy is deposited upon a clean silicon surface, as described above, the processes described herein provide for subsequent deposition of an epitaxial silicon emitter layer upon the SiGe base. FIG. 6 depicts a flow chart generally showing a process for forming an epitaxial emitter in accordance with the preferred embodiments of the present invention. In the first step 260, an epitaxial base layer of silicon-germanium alloy is initially formed on a substrate 16. Preferably, this base layer is formed through low temperature deposition 250, as illustrated in FIG. 5. Through normal processing, this substrate 16 may have been previously exposed to oxygen either within the reaction chamber 12 or as it was transported from another semiconductor processing apparatus (not illustrated) into the chemical vapor deposition reactor 10. Next, the substrate 16 is moved 270 into the reaction chamber 12, and a low temperature bake 280 is conducted. The low temperature bake step 280 is performed as described previously, and effectively removes nearly all oxygen and carbon contamination from the surface of the substrate 16, preferably without exhausting the thermal budget. As illustrated, the low temperature bake 280 is preferably followed in-situ by a low temperature deposition, substantially as discussed previously. During this step, an emitter is grown epitaxially 290. Preferably, the emitter is formed of Si, but may also be formed of SiC.

By processing the SiGe base according to the methods of the present invention, the germanium's thermal budget is not exhausted. The low temperature nature of these processes also allow for higher concentrations and thicknesses of germanium in the base layer. Consequently, the crystal lattice structure of the stressed SiGe layer does not relax, and dislocations do not appear in the base layer. Advantageously, the absence of dislocations, coupled with the exceptionally clean surface, allow a silicon or silicon-carbon emitter layer to be grown epitaxially upon the SiGe base layer without relaxing the crystal structure.

Preferably, the silicon germanium layer has a thickness of at least about 250 Å, more preferably greater than about 650 Å. Furthermore, separate chambers are most preferably employed for depositing the SiGe base layer and the subsequent silicon-containing emitter. That way, memory effects and consequent contamination can be avoided, using dedicated process chambers for each deposition. At the same time, oxide and other contaminants from transport between chambers can be cleaned by the disclosed low temperature bake, without risk of relaxing the SiGe strained layer.

The processes described herein enable a low temperature and rapid hydrogen bake while still providing very clean silicon surfaces for subsequent deposition. Accordingly, shallow junctions can maintain their integrity. Advantageously, SiGe HBT BiCMOS devices can now be created while maintaining a high rate of throughput. Furthermore, the combination of the described low temperature bake with relatively low temperature deposition, conducted in-situ, allows for other considerable improvements in wafer throughput, lowering overall costs of operation. Low temperature plasma chamber cleaning, in combination with the above, provides even further benefits to throughput, while still maintaining the purity desired of state-of-the-art semiconductor fabrication.

It will be appreciated by those skilled in the art that various modifications and changes can be made without departing from the scope of the invention. Similar other modifications and changes are intended to fall within the scope of the invention, as defined by the appended claims.

We claim:

1. A method for growing an epitaxial silicon-containing layer on a silicon-germanium layer, the method comprising:
    inserting the silicon substrate with a silicon-germanium layer into a first reaction chamber and onto a susceptor housed within the chamber;
    subjecting the substrate to a bake; and
    epitaxially forming a silicon-containing layer on top of the silicon-germanium layer,
    wherein subjecting the substrate to a bake comprises delivering a greater ratio of power to an upper bank of lamps as compared to a neutral ratio of power between the upper bank and a lower bank of lamps, where the neutral ratio of power is optimized to maintain the substrate temperature the same as the susceptor temperature.

2. The method of claim 1, wherein the greater ratio of power is greater than 25% higher than the neutral ratio.

3. A method of treating a semiconductor substrate having an exposed semiconductor region subject to oxidation, comprising:
    loading the substrate onto a susceptor in a chemical vapor deposition reaction chamber at less than 550° C.;
    subjecting the substrate to a bake in a reducing environment for less than 45 seconds;
    stabilizing the substrate temperature after the bake; and
    depositing a layer by chemical vapor deposition directly over the semiconductor region after stabilizing the temperature;
    wherein subjecting the substrate to a bake comprises delivering a greater ratio of power to an upper bank of lamps as compared to a neutral ratio of power between the upper bank and a lower bank of lamps, where the neutral ratio of power is optimized to maintain the substrate temperature the same as the susceptor temperature.

4. The method of claim 3, wherein the greater ratio of power is greater than 25% higher than the neutral ratio.

* * * * *

UNITED STATES PATENT AND TRADEMARK OFFICE
CERTIFICATE OF CORRECTION

| | | |
|---|---|---|
| PATENT NO. | : 7,108,748 B2 | Page 1 of 1 |
| APPLICATION NO. | : 10/158393 | |
| DATED | : September 19, 2006 | |
| INVENTOR(S) | : Brabant et al. | |

It is certified that error appears in the above-identified patent and that said Letters Patent is hereby corrected as shown below:

On title page (56)
On Page 2, Column 2, Line 11, After "6,566,279" Delete"B1" and insert -- B2 --, therefore.

On title page (56)
On Page 2, Column 2, Line 12, After "6,593,211" Delete"B1" and insert -- B2 --, therefore.

Signed and Sealed this

Twelfth Day of June, 2007

JON W. DUDAS
*Director of the United States Patent and Trademark Office*